(12) United States Patent
Amin et al.

(10) Patent No.: US 9,305,812 B2
(45) Date of Patent: Apr. 5, 2016

(54) DIE EJECT ASSEMBLY FOR DIE BONDER

(71) Applicant: Texas Instruments Incorporated, Dallas, TX (US)

(72) Inventors: Ali Imran Amin, Selangor (MY); Hamdan Hamid, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 324 days.

(21) Appl. No.: 13/794,387

(22) Filed: Mar. 11, 2013

(65) Prior Publication Data

US 2014/0251760 A1 Sep. 11, 2014

(51) Int. Cl.
| B32B 38/10 | (2006.01) |
| H01L 21/67 | (2006.01) |
| H01L 21/683 | (2006.01) |
| H01L 21/687 | (2006.01) |

(52) U.S. Cl.
CPC ...... *H01L 21/67132* (2013.01); *H01L 21/6836* (2013.01); *H01L 21/68778* (2013.01); *H01L 2221/68386* (2013.01); *Y10S 156/932* (2013.01); *Y10S 156/943* (2013.01); *Y10T 29/49826* (2015.01); *Y10T 156/1132* (2015.01); *Y10T 156/1179* (2015.01); *Y10T 156/1744* (2015.01); *Y10T 156/1944* (2015.01); *Y10T 156/1983* (2015.01)

(58) Field of Classification Search
CPC ............ H01L 21/6835; H01L 21/6836; H01L 21/68778; H01L 21/68785; H01L 2221/68322; H01L 2221/68336; H01L 2221/68354; H01L 2221/68381; H01L 2221/68386; Y10T 156/1744; Y10T 156/1132; Y10T 156/1944; Y10T 156/1179; Y10T 156/1983; Y10S 156/932; Y10S 156/943
See application file for complete search history.

(56) References Cited

U.S. PATENT DOCUMENTS

| 3,593,983 | A | * | 7/1971 | Csenyi | E04G 15/061 248/205.9 |
| 3,657,812 | A | * | 4/1972 | Lee | B62B 1/08 30/162 |
| 3,713,221 | A | * | 1/1973 | Malmin | A61C 1/04 433/102 |
| 4,472,218 | A | * | 9/1984 | Avedissian et al. | 156/64 |
| 4,763,412 | A | * | 8/1988 | Basavanhally et al. | 29/845 |
| 7,759,164 | B2 | * | 7/2010 | Maki et al. | 438/113 |
| D637,851 | S | * | 5/2011 | Hsieh | D6/567 |
| 8,221,583 | B2 | * | 7/2012 | Min et al. | 156/707 |
| 2009/0007420 | A1 | * | 1/2009 | Kabeshita et al. | 29/740 |
| 2011/0088845 | A1 | * | 4/2011 | Chong et al. | 156/344 |

* cited by examiner

*Primary Examiner* — Mark A Osele
(74) *Attorney, Agent, or Firm* — Steven A. Shaw; Frank D. Cimino

(57) ABSTRACT

Disclosed herein is a die eject assembly for a die bonder that may include a poker pin having an elongate shaft portion with a first end and a second end. The poker pin further includes a base portion having a first end and a second end. The base portion has a maximum diameter that is larger than the maximum diameter of the elongate shaft portion. The elongate shaft portion first end is fixedly attached to the base portion second end.

17 Claims, 7 Drawing Sheets

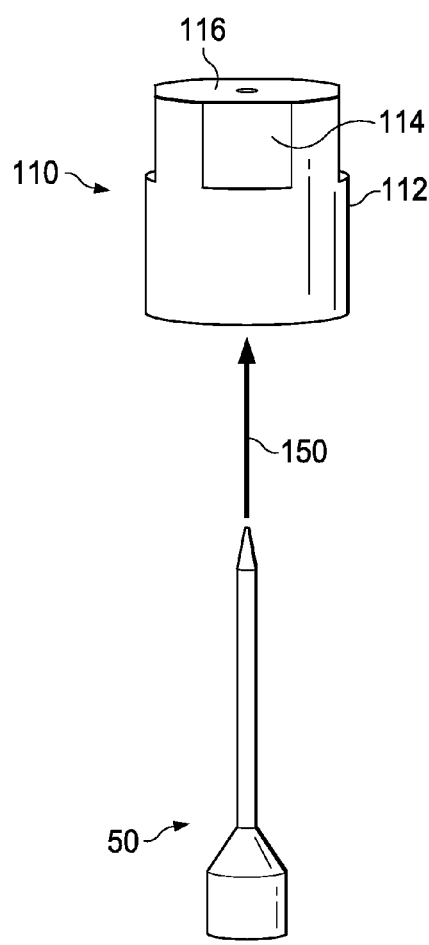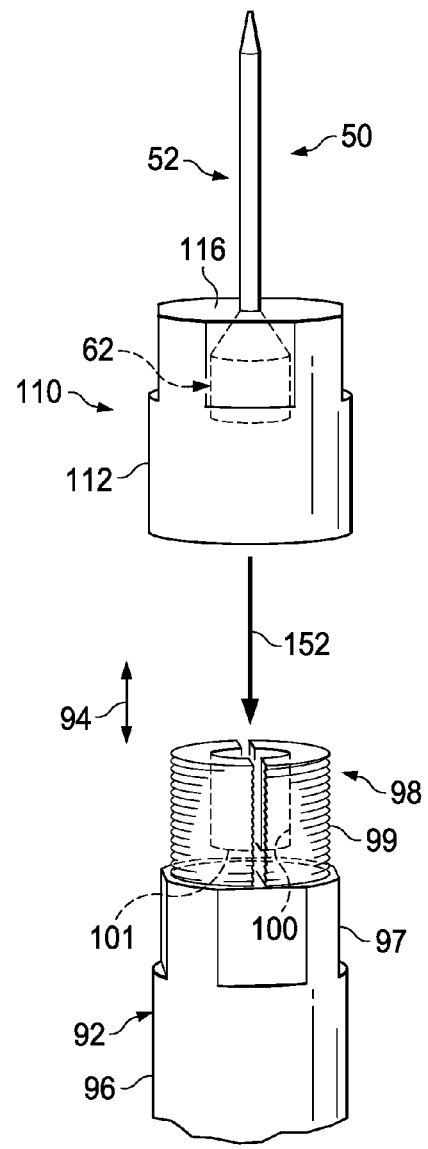
FIG. 4
FIG. 5

DIE EJECT ASSEMBLY FOR DIE BONDER

BACKGROUND

A die bonder is used for bonding semiconductor dies to a substrate. Dies are ejected from a die presentation system at a die eject stage of the die bonder. The dies are then picked up by an appropriate tool such as a pick and place machine. Various types of die presentation systems are used in different situations. Known die presentation systems include wafer rings, film frames and waffle packs. The die presentation system is held in a holder which is moved laterally over a die eject assembly. The die eject assembly typically includes a vacuum cylinder covered by a metal cap. Dies are held against the metal cap by a vacuum in the cylinder. The metal cap includes a hole through which a small diameter pin known as a poker pin may be projected. The reciprocating assembly that supports the poker pin has an up position at which the pin extends a preset distance above the cap and a down position in which the tip of the pin is positioned below the cap. In the up position, the pin contacts the back of a die to eject it from the associated die presentation system.

BRIEF DESCRIPTION OF THE DRAWINGS

FIG. 4 is a side elevation view of the poker pin of FIGS. 2 and 3 and a poker pin lock member.

FIG. 5 is a side elevation view of the poker pin and lock member of FIG. 4 and a reciprocating member having a poker pin holder at one end thereof.

DETAILED DESCRIPTION

Figure 1:
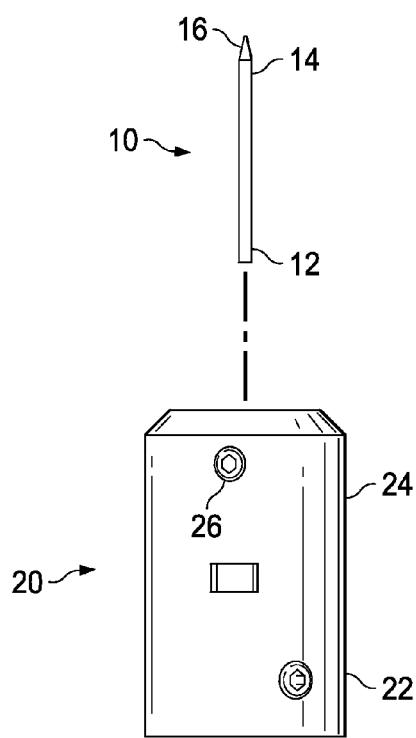
FIG. 1 is a side elevation view of a prior art poker pin and a poker pin holder in which the poker pin is mounted.

This specification, in general, discloses a die eject assembly 45 for a die bonder. The die eject assembly 45 includes a poker pin 50, FIG. 2, having an elongate shaft portion 52 with a first end 54 and a second end 56. The poker pin also includes a base portion 62 having a first end 64 and a second end 72. The first end 64 of the base portion 62 has a maximum diameter that is larger than the maximum diameter of the elongate shaft portion 52. The first end 54 of the elongate shaft portion 52 is fixedly attached to the second end 72 of the base portion 62. The die eject assembly 45 may also include a poker pin holder 98, FIG. 5, on an end portion 97 of a reciprocating member 92. The poker pin holder 98 receives and supports the poker pin 50. A poker pin lock member 110 may be displaceably mounted on the poker pin holder 98 and may have a locked state in which the poker pin 50 is held in a predetermined fixed relationship with the poker pin holder 98. The die eject assembly 45 may also include a generally tubular vacuum dome 176 that has is in fluid communication with a vacuum source 180. The vacuum dome 176 has a die support surface 174 mounted at one end thereof. The reciprocating member 92 is vertically reciprocally displaceable within the vacuum dome 176. Upward displacement of the reciprocating member 92 is restrained by a stopper member 184 mounted in the vacuum dome 176. Having thus generally described a die eject assembly 45, further details thereof and methods associated therewith will now be described.

FIG. 1 is a side elevation view of a prior art poker pin 10 and poker pin holder 20. The poker pin 10 has a first end portion 12 and an opposite second end portion 14. The second end portion 14 terminates in a tip portion 16 which is generally truncated cone shaped. Except for the tip portion 16, the poker pin 10 has a constant diameter. A typical diameter range for poker pins 10 is about 0.5 mm to 0.8 mm. The poker pin 10 is adapted to be mounted in a poker pin holder 20. The poker pin holder 20 has a first end 22 that is adapted to be mounted on a reciprocating shaft 21, FIG. 9. A second end 24 of the poker pin holder 20, FIG. 1, has a central bore (not shown) that is adapted to receive the poker pin 10. The poker pin 10 is held in position by tightening a lock screw 26, which extends transversely with respect to the poker pin 10. Various other types of poker pin holders are known in the art. Each of these prior art holders is adapted to hold a constant diameter poker pin at an axially adjustable position within a poker pin holder. In some cases this adjustment is made automatically, as with a set up jig and dial meter. In other cases, the set up is made by an operator who sets the poker pin height manually and then holds it in position with a lock screw or other clamping type device. Both of these prior art systems are subject to error. For example, in the automatic set up system it is easy for an operator to select an incorrect height parameter from a computer menu. With the mechanical set up, there will be slight variation as different operators exercise different judgment about the proper position of the poker pin tip. A die eject assembly 45 is described below which eliminates such variations in poker pin height selection. Thus, damage to dies associated with incorrect poker pin height is eliminated.

Figure 2:
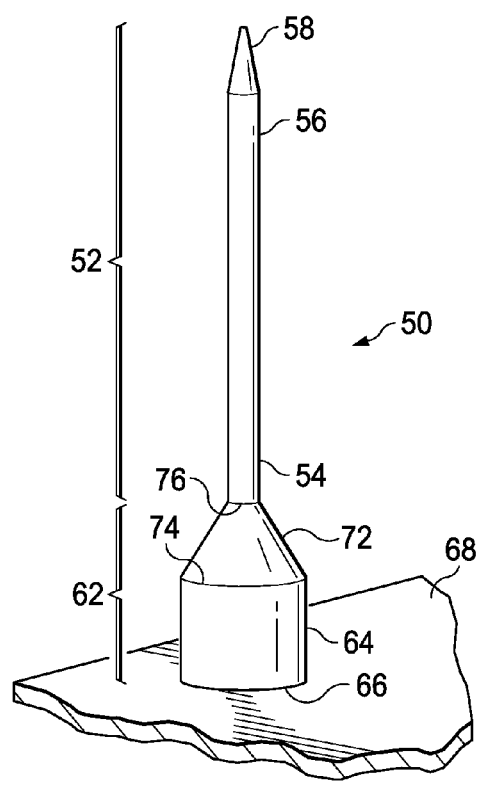
FIG. 2 is a perspective view of a poker pin.
Figure 3:
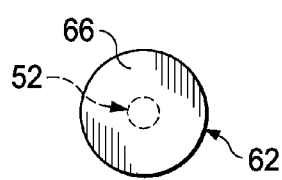
FIG. 3 is a bottom plan view of the poker pin of FIG. 2.
Figure 6:
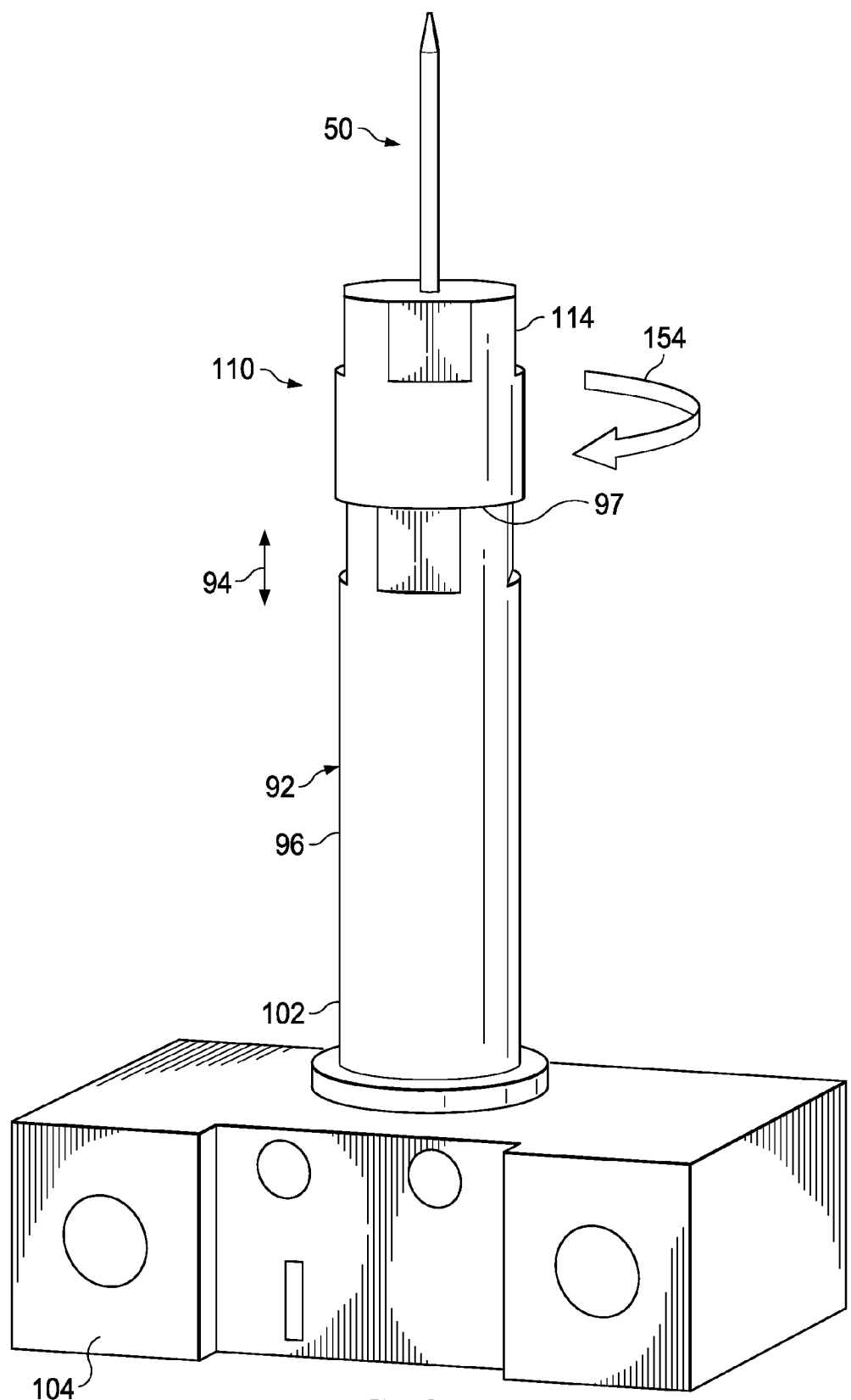
FIG. 6 is an isometric view of the reciprocating member, poker pin holder, poker pin and lock member of FIG. 5 in an assembled state.
Figure 10:
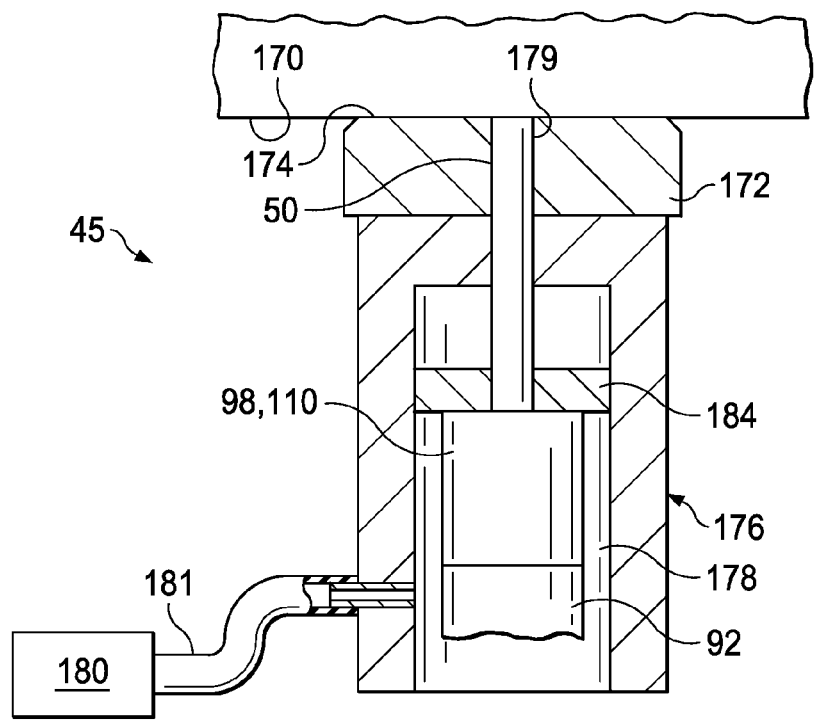
FIG. 10 is a schematic, cross sectional elevation view of a die eject assembly with a poker pin stopper.

FIG. 2 illustrates a poker pin 50 that may be used in applicant's die eject assembly 45. The poker pin 50 has an elongate shaft portion 52 with a first end 54 and a second end 56. The second end 56 may terminate in a pointed tip portion 58. The diameter of the elongate shaft portion 52 may be constant from the first end 54 to the second end 56 except for the pointed tip portion 58. A typical diameter range for the elongate shaft portion 52 is from about 0.5 mm to about 0.8 mm. The poker pin 50 includes a base portion 62 having a first end 64 which may be cylindrical and which may terminate in a flat circular bottom 66 as illustrated in FIG. 3. In FIG. 2 the circular flat bottom 66 rests on a flat support surface 68. The flat circular bottom surface 66 is adapted to sit on a flat abutment surface 101, FIG. 5, in a poker pin holder 110, as described in further detail below. The base portion 62 has a second end 72 which may have a truncated cone shape. The first and second ends 64, 72 meet at region 74. The second end 72 of the base portion 62 is connected to the first end 54 of the elongate shaft portion 52 at region 76. From FIG. 2, it may be seen that the maximum diameter of the elongate shaft portion 52 is substantially smaller than the maximum diameter of the base portion 62. A typical diameter range for the elongate shaft portion 52 may be the same as the diameter range of prior art poker pins 10, e.g., 0.5 mm to 0.8 mm. A typical diameter range of the cylindrical first end 64 of the base portion 62 is, for example, from 2.6 mm to 3.0 mm. As best illustrated in FIGS. 5, 6 and 10 a reciprocating member 92 reciprocates vertically 94 between a maximum height position and a minimum height position. As shown in FIGS. 5 and 6, the reciprocating member 92 comprises a shaft portion 96 having an upper end 97 that includes a poker pin holder 98. Poker pin holder 98 may be provided by a threaded, split collar portion 99 of shaft upper end 97. Poker pin holder 98 has a poker pin base receiving cylindrical bore 100 that terminates at a flat bottom wall 101, as best shown in FIG. 5. The poker pin 50 may be slidingly received in the cylindrical bore 100 that partially defines split collar portion 99. A lower end 102 of the shaft portion 96, FIG. 6, is attached to a connection member 104, which may be conventionally attached to a reciprocating drive assembly (not shown).

Figure 7:
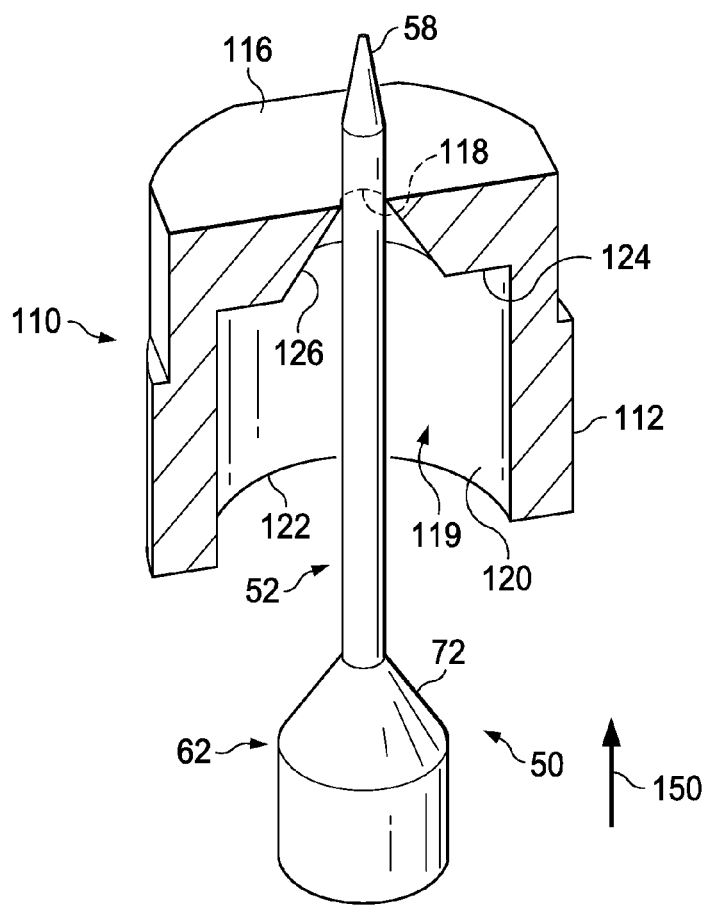
FIG. 7 is a partially cross sectional, isometric view of the lock member and poker pin in a preassembled state.
Figure 8:
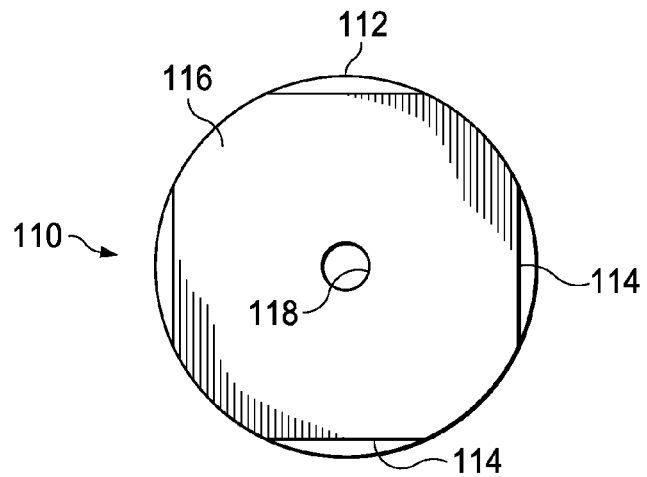
FIG. 8 is a top plan view of the poker pin lock member.

A poker pin lock member 110 is illustrated in FIGS. 4-7. The poker pin lock member 110 may have an outer cylindrical surface 112. This cylindrical surface 112 may be intersected by four flat, equally circumferentially spaced surfaces 114 that are adapted for receiving a wrench. The poker pin lock member 110 may have a flat circular top surface 116, FIG. 8, having a small circular opening 118 therein through which the elongate shaft portion 52 of the poker pin 50 may pass. As is best illustrated by FIG. 7, the poker pin lock member 110 may have an interior cavity 119 defined by a cylindrical lower interior wall surface 120 terminating in a lower circular opening 122. The cavity 119 may be further defined by an upper wall surface having a horizontally disposed surface portion 124 and a truncated cone shaped wall portion 126 which ends in top hole 118. This truncated cone shaped surface portion 126 of the upper wall surface is adapted to engage truncated cone shaped second end 72 of the poker pin base portion 62. The co-action between the surface of base portion second end 72 and truncated cone shaped surface portion 126 urges the poker pin 50 into a centered position within the poker pin holder 98 as the lock member 110 is moved toward its downward most position. Thus surface portion 126 is a centering surface.

In operation, the poker pin 50 is inserted into the poker pin lock member 110, FIGS. 4 and 7, by moving it upwardly 150 into the lock member cavity 119. In the illustration of FIG. 5, the poker pin 50 is fully seated in the lock member 110 with the upper surface 72 of the poker pin base 62 in engagement with the truncated cone shaped surface portion 126 of the lock member 110. The lock member 110 and poker pin 50 as assembled in FIG. 5 are moved into generally cylindrical cavity 100 in poker pin holder 98 by downward displacement of the lock member 110. The lock member 110 cylindrical interior wall surface 120 may be threaded to co-act with exterior threads provided on the split tip portion 99 of the poker pin holder 98. Thus, the lock member 110 may be downwardly displaced by rotational movement 154, as illustrated in FIG. 6. The poker pin lock member 110 will continue to advance downwardly through rotation until the poker pin base portion bottom surface 66 engages the flat bottom surface 101 defining cavity 100. The point of abutting contact of these two surfaces 66, 101 determines the height of the poker pin elongate shaft tip portion 58 with respect to the poker pin holder 98. The poker pin holder 98 moves between known fixed limits with regard to a die presentation assembly 170, FIG. 10. Thus, the poker pin 50 is always in proper registration with the die presentation assembly 170 so long as the poker pin holder 98 is in proper registration with the die presentation assembly 170, as described further below with reference to FIG. 10.

Figure 9:
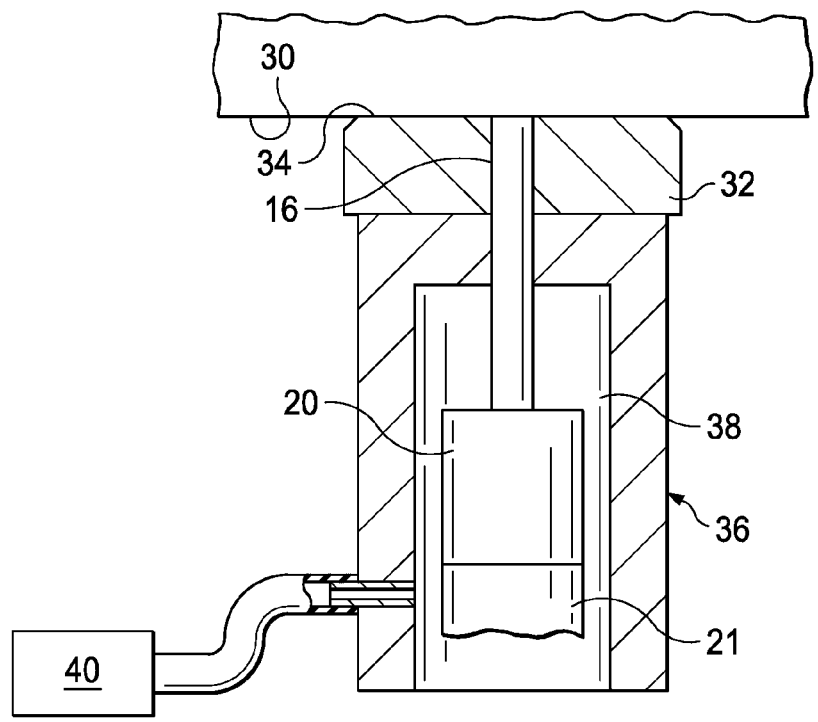
FIG. 9 is a schematic, cross sectional view of a prior art die eject assembly.

FIG. 9 schematically illustrates the operation of a prior art die eject assembly. A conventional poker pin holder 20 is mounted on a reciprocating shaft 21. A poker pin 116 mounted in poker pin holder 20 reciprocates up and down by conventional mechanical displacement of shaft 21. A die presentation assembly 30 is positioned above the poker pin 16 and the poker pin 16 engages the back surface of a die within the die presentation assembly 30 when the poker pin 16 is in its uppermost position of reciprocating movement. The die presentation assembly 30 is positioned above a support structure 32 having a top surface 34 that supports the dies in the die presentation assembly. The support structure 32 has small holes (not shown) in fluid communication with a cylindrical cavity 38 of a vacuum dome 36. The cavity 38 is connected to a vacuum source 40 as through conduit. Vacuum thus holds a die within the die presentation assembly 30 against the support surface 34. Such structures are well known in the art and are thus not described in detail herein. One problem with this assembly is that improper adjustment of the poker pin 16 may cause it to have a maximum upward travel position above the position shown in FIG. 9. In this improper adjustment state, the poker pin 16 may damage the backside of the die as it moves upwardly to eject the die from the presentation assembly 30. Another potential source of die damage is over travel of the drive shaft on which the poker pin holder 20 is mounted. Applicants' above described poker pin 50, poker pin holder 98 and lock member 110 are adapted to solve the former problem. The die eject assembly 45 of FIGS. 10 and 11 is adapted to solve the latter problem.

Figure 11:
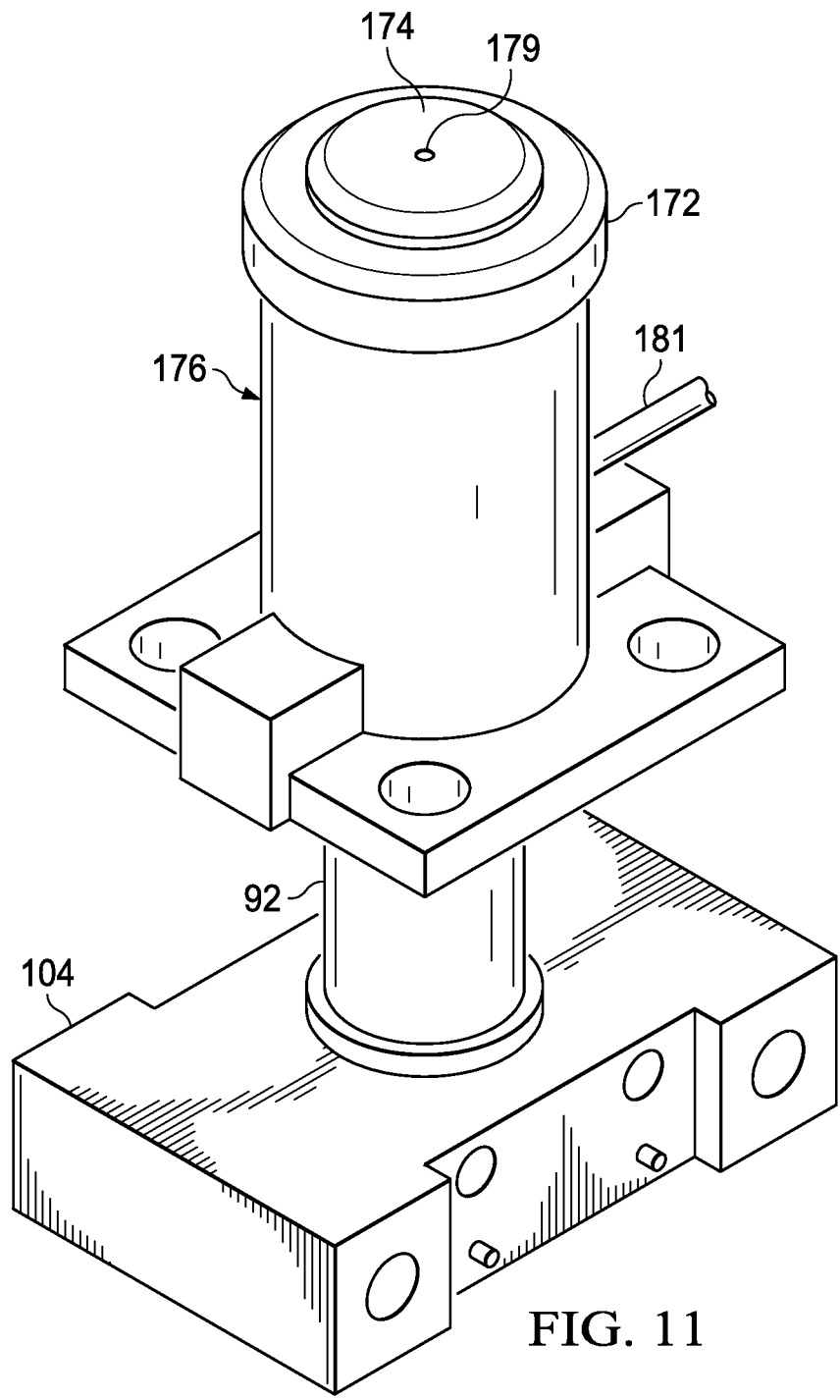
FIG. 11 is an isometric view of a die eject assembly such as shown schematically in FIG. 10.

In one embodiment the assembly 45 shown in FIGS. 10 and 11 incorporates the above described poker pin 50, poker pin holder 98 and lock member 110 and thus obviates both potential problems. In the die eject assembly 45 shown in FIGS. 10 and 11, a die presentation assembly 170, which may include individual dies, is supported by a support structure 172 having a top surface 174, which may be a die support surface. The support structure 174 has a poker pin receiving hole 179 extending therethrough. The support structure 172 is positioned above a vacuum dome 176 having a cylindrical cavity 178 in fluid communication with a vacuum source 180, as through vacuum supply conduit 181. In this embodiment, proper pin height of poker pin 50 with respect to the poker pin holder 110 may be ensured by the novel structure described with reference to FIGS. 2-8 above. In this embodiment, any poker pin 50 over travel associated with excess vertical displacement of shaft 92, etc., is prevented by a stopper member 184, which in the embodiment shown in FIG. 10 is an annular stopper member.

The reciprocating member 92 and the poker pin holder 98, lock member 110 and poker pin 50 supported thereon are all displaceable relative to the fixed vacuum dome 176. The annular stopper member 184 is mounted inside the vacuum dome 176 in fixed relationship therewith. The stopper member 184 is mounted at an axial position such that the poker pin 50 does not move axially upwardly sufficiently far to damage a die to be ejected from the die presentation assembly 170. The stop member 184 may be constructed and arranged so as to engage the top surface 116 of the lock member 110 or any other structure fixedly associated with the reciprocating shaft 92, for example a fixed flange (not shown) extending radially outwardly from shaft 92. It will be appreciated that in normal operation, the poker pin 50 may have a small range of heights above the poker pin holder 98 in which it will remove a die without causing damage thereto. Therefore the stop member 184 may be placed at a position associated with the uppermost extent of this proper operating range. Thus, in normal operation, the poker pin holder 110 may not engage the annular stop member 184. However, in situations in which the shaft 92 would otherwise over travel, for example, a situation where shaft length changes due to temperature related expansion, over travel is prevented by the stop member 184. Thus, damage to dies or to the poker pin 50 is prevented by the stop member 184. A suitable shock absorber or the like (not shown) may be incorporated into the shaft 92 or associated mechanical linkage such that engagement between the poker pin holder 110 and the stop member 184 does not cause damage to either structure.

It will be understood by those skilled in the art that the vacuum provided within the vacuum dome 176 is transmitted through the vacuum dome 176 and support structure 172 by suitable fluid communication which is not interrupted by the stop member 184. FIG. 11 shows one physical embodiment of the die eject assembly 45 that is illustrated schematically in FIG. 10.

Figure 12:
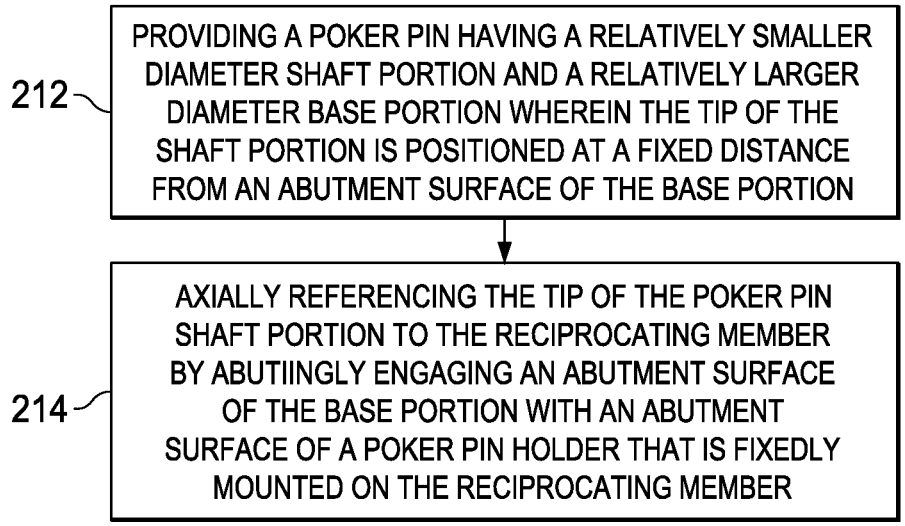
FIG. 12 is a flow chart of a method of installing a poker pin in a die bonding machine having a reciprocating member that is axially displaceable with respect to a die support surface.

It will be appreciated from the above that a method of installing a poker pin 50 in a die bonding machine having a reciprocating member 92 that is axially displaceable with respect to a die support surface 174 is illustrated by FIG. 12. As illustrated at block 212, it includes the step of providing a poker pin 50 having a relatively smaller diameter shaft portion 52 and a relatively larger diameter base portion 62, wherein the tip 58 of the shaft portion 52 is positioned at a fixed distance from an abutment surface 66 of the base portion 62. The method may further include, as shown at block 214, axially referencing the tip 58 of the poker pin shaft portion 52 to the reciprocating member 92 by abuttingly engaging the abutment surface 66 of the base portion 62 with an abutment surface 101 of a poker pin holder 98 that is fixedly mounted on the reciprocating member 92.

Figure 13:
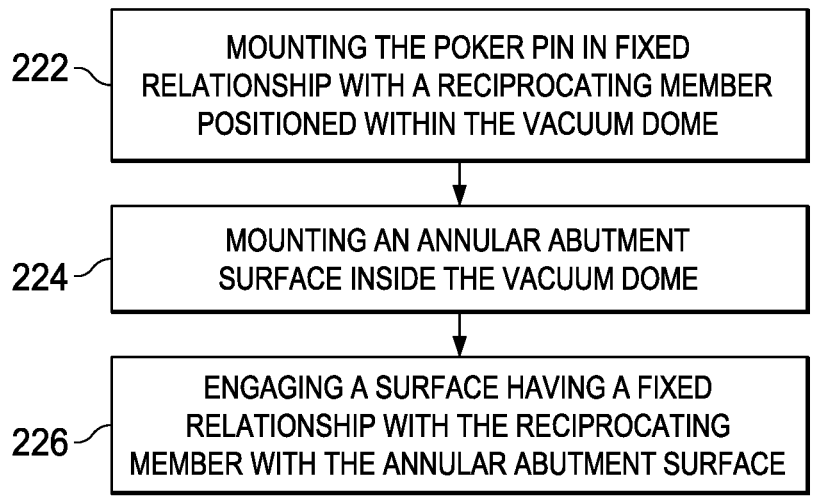
FIG. 13 is a flow chart of a method of limiting the travel of a poker pin with respect to a die support surface of a vacuum dome.

FIG. 13 shows a method of limiting the travel of a poker pin 50 with respect to a die support surface 174 of a vacuum dome 176. The method may include, as shown at block 222, mounting the poker pin 50 in fixed relationship with a reciprocating member 92 positioned within the vacuum dome 176. The method may further include, as shown at block 224, mounting an annular abutment surface such as stop member 184 inside the vacuum dome 176. The method may also include, as shown at block 226, engaging a surface 116 having a fixed relationship with the reciprocating member 92 with the annular abutment surface 184.

Although certain specific embodiments of a die eject assembly and methods of making and using it have been described in detail herein, various alternative embodiments of such assembly and methods will become obvious to persons of skill in the art after reading this disclosure. The claims appended hereto are intended to be broadly construed so as to cover all such alternative embodiments, except as limited by the prior art.

What is claimed is:

1. A die eject assembly for a die bonder comprising:
a reciprocating member having a first end;
a poker pin holder positioned at said first end of said reciprocating member
a poker pin being supported by said poker in holder, said poker pin comprising:
an elongate shaft portion having a first shaft end and a second shaft end;
a base portion having a first base end and a second base end, said first base end having a truncated cone shaped upper surface;
said first shaft end of said elongate shaft portion being fixedly attached to said second base end of said base portion; and
a poker pin lock member displaceably mounted on said poker pin holder and having a locked state in which said poker pin lock member holds said poker pin in fixed relationship with said poker pin holder.

2. The die eject assembly of claim 1 wherein said poker pin holder comprises a poker pin base support surface adapted to engage and support said poker pin base portion.

3. The die eject assembly of claim 2 wherein said poker pin holder comprises a collar portion positioned above said base support surface and adapted to slidingly receive said poker pin base portion therein.

4. The die eject assembly of claim 3 wherein said poker pin lock member is displaceably received in said poker pin holder.

5. The die eject assembly of claim 4 further comprising a poker pin centering surface mounted on said poker pin lock member and adapted to co-act with a surface of said poker pin base portion to center said poker pin in said poker pin holder when said lock member is in said locked state and wherein said lock member is threadingly received on said poker pin holder.

6. The die eject assembly of claim 5 wherein said poker pin centering surface comprises a truncated cone shaped centering surface engaging said truncated cone shaped upper surface of said poker pin base portion.

7. The die eject assembly of claim 6, wherein said poker pin truncated cone shaped centering surface comprises a central hole that receives said poker pin elongate shaft portion therethrough.

8. The die eject assembly of claim 1 further comprising a poker pin centering surface mounted on said poker pin lock member and adapted to co-act with a surface of said poker pin base portion to center said poker pin in said poker pin holder when said lock member is in said locked state.

9. The die eject assembly of claim 1, further comprising a tubular vacuum dome having an orifice therein in fluid communication with a vacuum source, and having an end portion comprising a die support surface, said reciprocating member being received in said tubular vacuum dome and being vertically reciprocally displaceable with respect thereto, upward displacement of said reciprocating member being limited by a stopper member mounted in said tubular vacuum dome.

10. The die eject assembly of claim 9, said die support surface having at least one hole extending therethrough, said stopper member having at least one hole extending therethrough and aligned with said hole in said in said die support surface, said elongate pin portion of said poker pin extending through said aligned holes and being reciprocally displaceable therewithin by displacement of said reciprocating member.

11. The die eject assembly of claim 10, said poker pin holder being engageable with said stop member.

12. A method of installing a poker pin in a die bonding machine having a reciprocating member that is axially displaceable with respect to a die support surface, said method comprising:
providing a poker pin having a relatively smaller diameter shaft portion and a relatively larger diameter base portion wherein the tip of the shaft portion is positioned at a fixed distance from an abutment surface of the base portion and said base portion has a truncated cone shaped top surface;
axially referencing the tip of the poker pin shaft portion to the reciprocating member by abuttingly engaging the abutment surface of the base portion with an abutment surface of a poker pin holder that is fixedly mounted on the reciprocating member; and centering the poker pin with respect to the poker pin holder by abuttingly engaging the truncated cone shaped top surface portion of the poker pin base portion with a truncated cone shaped bottom surface of a displaceable lock member mounted on the poker pin holder.

13. A method of installing a poker pin in a die bonding machine having a reciprocating member that is axially displaceable with respect to a die support surface comprising:

providing a poker pin having a relatively smaller diameter shaft portion and a relatively larger diameter base portion wherein the tip of the shaft portion is positioned at a fixed distance from an abutment surface of the base portion and said base portion has a truncated cone shaped top surface;

axially referencing the tip of the poker pin shaft portion to the reciprocating member by abuttingly engaging the abutment surface of the base portion with an abutment surface of a poker pin holder that is fixedly mounted on the reciprocating member;

axially displacing the reciprocating member within a tubular vacuum dome; and limiting the distance above a die support assembly that the tip portion travels with a stop member mounted within the vacuum dome.

14. The method of claim 4 wherein said limiting the distance above a die support assembly that the tip portion travels with a stop member mounted within the vacuum dome comprises engaging the poker pin holder with the stop member.

15. A method of limiting the travel of a poker pin with respect to a die support surface of a vacuum dome comprising:

mounting the poker pin in fixed relationship with a reciprocating member positioned within the vacuum dome;

mounting an abutment truncated cone shaped surface inside the vacuum dome; and engaging a truncated cone shaped surface having a fixed relationship with the reciprocating member with the abutment truncated cone shaped surface.

16. The method of claim 15 wherein said engaging a truncated cone shaped surface having a fixed relationship with the reciprocating member with the abutment surface comprises engaging an upper truncated cone shaped surface of a poker pin holder with the abutment truncated cone shaped surface.

17. The method of claim 16 further comprising passing an elongated shaft portion of the poker pin through a central opening in the abutment truncated cone shaped surface.

* * * * *